United States Patent [19]

Hunt et al.

[11] Patent Number: 5,315,128

[45] Date of Patent: May 24, 1994

[54] PHOTODETECTOR WITH A RESONANT CAVITY

[75] Inventors: Neil E. J. Hunt, Scotch Plains; Erdmann F. Schubert, New Providence; George J. Zydzik, Columbia, all of N.J.

[73] Assignee: AT&T Bell Laboratories, Murray Hill, N.J.

[21] Appl. No.: 54,947

[22] Filed: Apr. 30, 1993

[51] Int. Cl.$^5$ .............................................. H01L 27/14
[52] U.S. Cl. ....................................... 257/16; 257/17; 257/21; 257/22; 257/458
[58] Field of Search ................ 257/21, 184, 185, 436, 257/17, 22, 16, 458, 432

[56] References Cited

U.S. PATENT DOCUMENTS

| | | | |
|---|---|---|---|
| 4,790,635 | 12/1988 | Apseley | 359/321 X |
| 4,861,976 | 8/1989 | Jewell et al. | 257/21 |
| 5,229,627 | 7/1993 | Kosaka | 257/436 X |

FOREIGN PATENT DOCUMENTS 61-229371 10/1986 Japan ................... 257/436

OTHER PUBLICATIONS

Kishino et al., "Resonant Cavity-Enhanced (RCE) Photodetectors", IEEE Journal of Quantum Electronics, vol. 27, No. 8, Aug. 1991, pp. 2025-2034.
Chin et al., "Multilayer Reflectors by Molecular-Beam Epitaxy for Resonance Enhanced Absorption in Thin High-Speed Detectors," J. Vac. Sci. Technol. B 8(2), Mar./Apr. 1990, pp. 339-342.
Dentai et al., "High Quantum Efficiency, Long Wavelength InP/InGaAs Microcavity Photodiode," Electronics Letters, vol. 27, No. 23, Nov. 7, 1991, pp. 2125-2126.
Prank et al., "Metal-Semiconductor-Metal Photodetector with Integrated Fabry-Perot Resonator for Wavelength Demultiplexing High Bandwidth Receivers," Appl. Phys. Lett. 62(2), Jan. 11, 1993, pp. 129-130.
Ünlü et al., "A Theoretical Study of Resonant Cavity-Enhanced Photodetectors with Ge and Si Active Regions," J. Appl. Phys. 71(8), Apr. 15, 1992, pp. 4049-4058.

*Primary Examiner*—William Mintel
*Attorney, Agent, or Firm*—Oleg E. Alber

[57] ABSTRACT

Described is a resonant-cavity p-i-n photodetector based on the reflection or transmission through a Fabry-Perot cavity incorporating non-epitaxial, amorphous layers with alternating refractive index difference which layers are electron-beam deposited on a light-gathering side of a commercially available photodetector. The materials of the Fabry-Perot cavity are selectable from materials, refractive indices of which fall within a large range (from n=1.26 for $CaF_2$ to n=3.5 for Si) preferably from materials which are depositable in an amorphous state. The material combinations are selected so that only wavelengths resonant with the cavity mode will be detected. The microcavity of the RC-PIN design can also be deposited on any existing detector structure, without modification of semiconductor growth. Such a photodetector would be useful for wavelength de-multiplexing applications. The ease of layer deposition, as well as the high degree of tailorability of spectral position, spectral detection width, and maximum numerical aperture of efficient detection, make the RC-PIN attractive for use in wavelength demultiplexing applications. An exemplary RC-PIN photodetector includes a $Si/SiO_2$ Fabry-Perot cavity electron-beam deposited on the InP substrate of a commercial InGaAs photodetector. The detection efficiency relative to a reference device was 52 percent at the resonant wavelength of 1350 nm, with a resonance width of 14 nm, and a 4 percent response for off-resonance wavelengths in the 1100-1700 nm range.

8 Claims, 2 Drawing Sheets

PHOTODETECTOR WITH A RESONANT CAVITY

FIELD OF THE INVENTION

This invention concerns photodetectors with a resonant cavity.

BACKGROUND OF THE INVENTION

Wavelength selective detectors are useful in wavelength-division multiplexing applications. By sending separate signals at different wavelengths through an optical fiber, and detecting these wavelengths separately, one can increase the information capacity of a communications system. The light sources could consist of semiconductor lasers or narrow-spectrum light emitting diodes (LEDs) such as a resonant cavity LED (RCLED). The detection system must be able to demultiplex the signal, i.e., detect the different wavelength signals separately. Each detector in the demultiplexing scheme must be able to detect the light from its design wavelength with good efficiency, while being insensitive to all other wavelengths in order to minimize crosstalk between channels.

Recently, resonant cavity enhanced (RCE) photodetectors have been studied for use in wavelength-division multiplexing applications. These designs place the absorbing region of a photodetector within a Fabry-Perot resonant cavity consisting of epitaxial semiconductor layers. Such devices can exhibit high speed, can have thin absorption regions, and detect light most strongly at the resonant wavelength of the cavity while reflecting non-resonant wavelengths. These devices, however, require the growth of a thick epitaxial distributed Bragg reflector (DBR) semiconductor mirror below and usually above the active region. For example, see K. Kishino et al., "Resonant Cavity—Enhanced (RCE) Photodetectors", IEEE Journal of Quantum Electronics, Vol. 27, No. 8, August 1991, pages 2025-2026.

SUMMARY OF THE INVENTION

This invention is a resonant-cavity p-i-n photodetector based on the reflection or transmission through a Fabry-Perot cavity incorporating non-epitaxial, amorphous layers with alternating refractive index difference which layers are electron-beam deposited on a light-gathering side of a commercially available photodetector. The materials of the Fabry-Perot cavity are selectable from materials refractive indices of which fall within a large range (from $n=1.26$ for $CaF_2$ to $n=3.5$ for Si) preferably from materials which when deposited are in an amorphous state. The material combinations are selected so that only wavelengths resonant with the cavity mode will be detected. The microcavity of the RC-PIN design can be deposited by electron beam evaporation on any existing detector structure, without modification of semiconductor growth. Such a photodetector would be useful for wavelength demultiplexing applications. The ease of layer deposition, as well as the high degree of tailorability of spectral position, spectral detection width, and maximum numerical aperture of efficient detection, make the RC-PIN attractive for use in wavelength demultiplexing applications. An exemplary RC-PIN photodetector includes a $Si/SiO_2$ Fabry-Perot cavity electron-beam deposited on an InP substrate of a commercial InGaAs photodetector. The detection efficiency relative to a reference device was 52 percent at the resonant wavelength of 1350 nm, with a resonance width of 14 nm, and a 4 percent response for off-resonance wavelengths in the 1100–1700 nm range.

DETAILED DESCRIPTION

This invention embodies a wavelength-selective photodetector which consists of a p-i-n semiconductor structure and an adjacent resonant optical microcavity formed by an active region and a pair of DBR mirrors. The cavity can consist of a variety of transmitting material combinations which may be deposited by a number of deposition techniques. The material combinations are selected so that only wavelengths resonant with the cavity mode will be detected.

Figure 1:
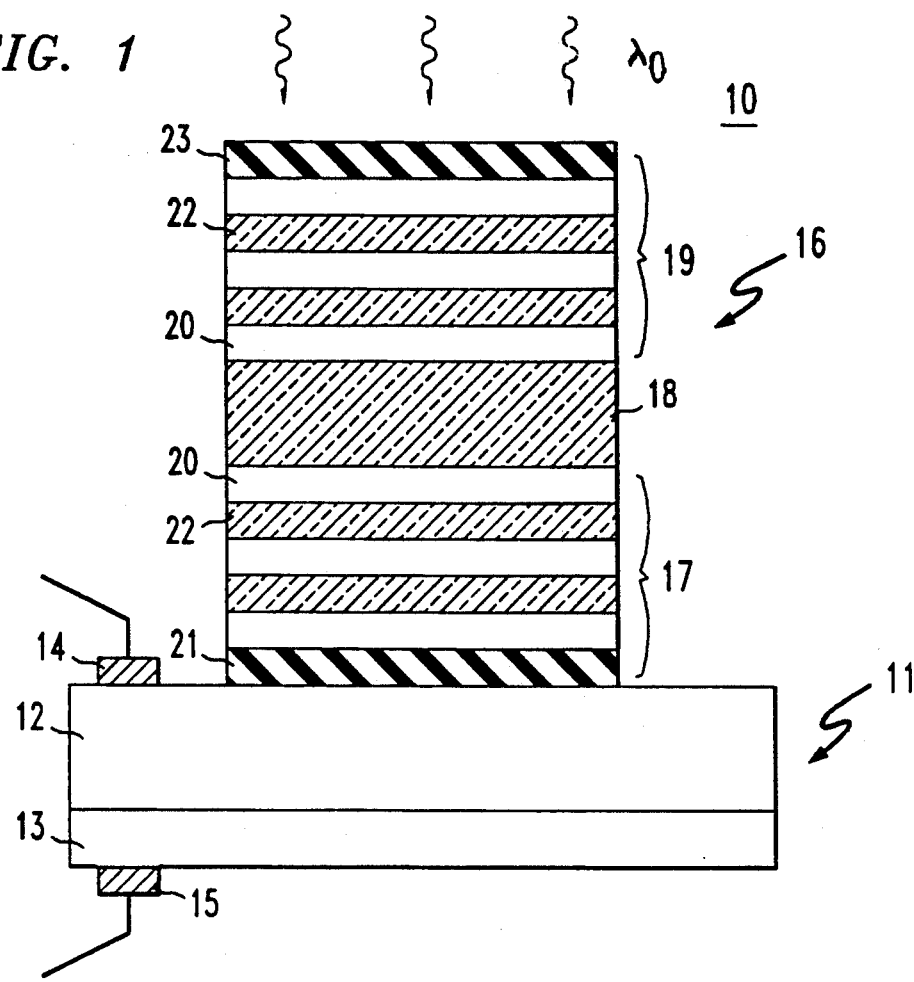
FIG. 1 is a schematic representation of a structure of a Fabry-Perot resonant microcavity formed on the light collecting surface of a standard p-i-n photodetector.

The RC-PIN photodetector, 10, embodying the invention is schematically represented in FIG. 1 of the drawings. For illustration purposes, various dimensions of the device are not shown to scale. Photodetector 10 includes a photodetector structure, 11, including a semiconductor substrate 12, an absorbing region 13, and electrodes, 14 and 15, to the substrate and to the absorbing region, respectively. Photodetector 10 further includes a microcavity, 16, grown upon substrate 12. The microcavity includes a bottom distributed Bragg reflector (DBR) mirror, 17, an active region, 18, and a top DBR mirror, 19.

The DBR mirrors each include a plurality of pairs of layers, each layer being $\lambda/4$ thick, one layer in each pair having an index of refraction different from the index of refraction of another layer in the pair. The material of each layer, their respective index of refraction, and the number of pairs (or periods) of layers are being preselected to provide a desired reflectivity to each mirror, so as to induce the passage of optical radiation impinging on the top layer of the top mirror to pass onto and into the substrate of the photodetector.

This invention is described with reference to a microcavity formed by a sequence of layers of low and high refractive index, with active region 18 being of a low refractive index and adjacent layers 20 being high refractive index layers of the bottom and top DBR layers. Preferably these materials are selected from materials which, when deposited, are in an amorphous state. Use of electron beam evaporation permits a simple way of depositing such materials. In the specific example, the material with the high refractive index is Si ($n \approx 3.5$) and the material with the low refractive index is $SiO_2$ ($n \approx 1.46$). A layer, 21, adjacent the substrate is a low refractive index material, $SiN_x$, deposited as an antireflection coating on the substrate. SiN$_x$ layer is then followed by an alternative sequence of electron beam evaporated Si and SiO$_2$ layers 20 and 22, respectively, such that SiO$_2$ active region 18 is bounded by Si layers 20. The uppermost layer 23 in the top DBR is a low refractive layer different from SiO$_2$. In this example, this layer is Al$_2$O$_3$ (n≈1.64). This low refractive index adjoins an air layer (another low refractive index material). While this does not conform to the rule of alternating layers of high and low refractive indices, this is acceptable in order to have a match between the top and bottom reflectivities of the system.

In an exemplary embodiment of the invention RC-PIN photodetector 10 includes a commercial p-i-n InGaAs photodiode 11 grown upon an InP substrate 12 with the light being collected through the substrate. Surface collection is also possible with the present RC-PIN photodetector design. After a λ/4 thick SiN$_x$ layer is formed on the substrate by deposition, the rest of microcavity 16 is grown upon substrate 12 by electron beam evaporation of bottom DBR mirror 17, active region 18 and top DBR mirror 19 at a substrate temperature of 100° C. Bottom DBR mirror 17 is formed by deposition on the SiN$_x$ layer of an alternating succession of λ/4 thick Si (965 nm thick) and SiO$_2$ (1155 nm thick) layers ending with the Si layer. Next a SiO$_2$ active layer (or region) 18 was deposited in a thickness corresponding to λ/2=(2310 nm). This was followed by deposition upon the active layer or region 18 of another sequence of alternating λ/4 thick Si and SiO$_2$ layers forming top DBR mirror 19. The final layer of the top DBR mirror is a λ/4 thick Al$_2$O$_3$ layer, 23, deposited on top of the uppermost high refractive layer (Si) of the top DBR mirror to tune reflectivity of the top mirror for maximum transmission at the resonance vacuum wavelength $\lambda_o$ of 1350 nm. In the specific example the bottom DBR mirror was formed with 3 periods of low and high index layers, one of which included the SiN$_x$ layer. The top DBR mirror was formed also with 3 periods, one of which included the Al$_2$O$_3$ layer.

While this specific example is presented using Si and SiO$_2$ as the high and low refractive index materials, the materials may be selected from such high refractive index materials as Si(n≈3.5), GaP (n≈3.5), ZnS (n≈2.3), TiO$_2$ (n≈2.2), SiN$_x$ (n≈1.9), cubic zirconia (n≈1.9), and such low refractive index materials as TiO$_2$ (n≈2.2), SiN$_x$ (n≈1.9), cubic zirconia (n≈1.9), Al$_2$O$_3$ (n≈1.64), titanium silica glass (n≈1.54), phosphor silica glass (n≈1.5), borosilicate glass (n≈1.46), SiO$_2$ (n≈1.46), MgF$_2$ (n≈1.38) and CaF$_2$ (n≈1.3). In some instances materials of the low refractive index group having higher index of refraction, e.g. cubic zirconia (n≈1.9) or TiO$_2$ (n≈2.2) may be used in combination with such lower index of refraction as e.g. CaF$_2$ (n≈1.3), MgF$_2$ (n≈1.38), borosilicate glass (n≈1.46).

The cavity will be at resonance, and will transmit light if the following resonance condition is met:

$$\phi_{R1} + \phi_{R2} + \frac{4\pi n_{act} L_{act}}{\lambda_0} = 2m\pi \quad \text{mel} \tag{1}$$

wherein $\phi_{R1}$ and $\phi_{R2}$ are the reflection phases at the interfaces between the active layer and the bottom and top DBR mirrors, respectively, $n_{act}$ is the refractive index of the active layer, and $L_{act}$ is the thickness of the active layer. For $\lambda_0=1350$ nm, $\phi_{R1}=\pi$ and $\phi_{R2}=\pi$ and $L_{act}=\lambda_0/(2n_{act})=\lambda/2$. Different thicknesses for the DBR constituent layers or for the active layer or both, will shift the design wavelength. For active layer thicknesses greater than λ, two or more resonance wavelengths will exist within the high reflectivity region of the DBR mirrors.

Figure 2:
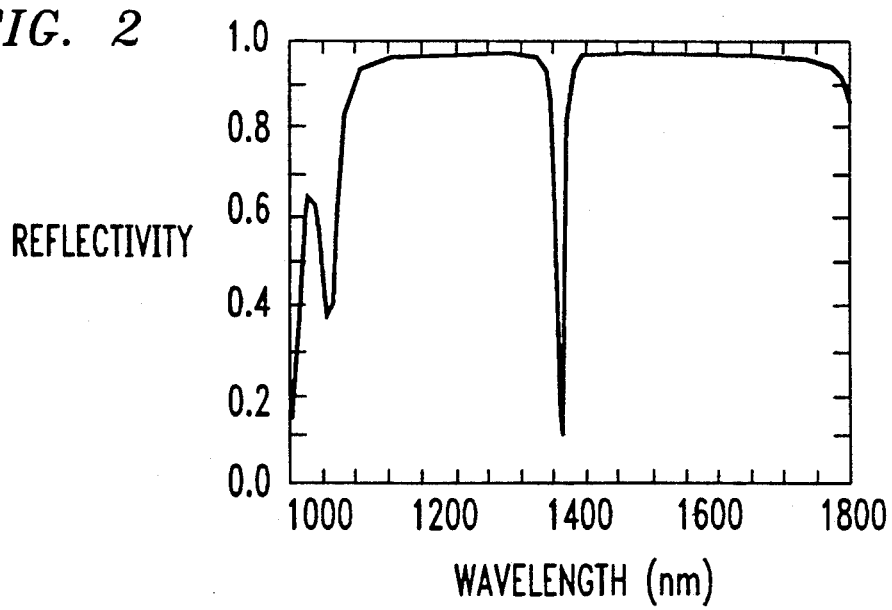
FIG. 2 is a plot of the reflection spectrum of a test wafer with a Fabry-Perot microcavity grown at the same time as the one on the photodetector.

The reflection spectrum of a reference wafer with the microcavity thereon is shown in FIG. 2. A high reflectivity region extends from 1000 nm to 1800 nm, with a reflection dip 15 nm wide at the cavity resonance of 1350 nm, corresponding to the transmission resonance of the microcavity. The reflection dip drops to 10 percent and has a width of 10 nm (8 meV). By fine tuning the top mirror reflectivity, the reflection on resonance can theoretically be reduced to zero. The spectral width of the reflectance dip $\Delta\lambda_0$ at wavelength position $\lambda_0$ is given by:

$$\frac{\Delta\lambda_0}{\lambda_0} = \frac{\lambda}{2L_{Cav}} \left( \frac{1 - \sqrt{R_1 R_2}}{\pi^4 \sqrt{R_1 R_2}} \right) \tag{2}$$

wherein $R_1$ and $R_2$ are top and bottom mirror reflectivities, respectively, and $L_{Cav}$ is the effective cavity length. The effective cavity length $L_{Cav}$ is a multiple of the wavelength of light, λ, within the cavity. For structures resulting from a 0.5 λ thick central SiO$_2$ region and a 0.2 λ effective penetration depth into each DBR mirror, $L_{Cav}\approx0.9$ λ. This $L_{Cav}$ is much shorter than the values obtainable in a semiconductor RCE detector, which are typically greater than 2.5 λ because of much greater mirror penetration depth. The smaller $L_{Cav}$ and large spectrum of high reflectance in this RC-PIN device is due to the large refractive index difference, which layers are between the Si layers (n≈3.5) and the SiO$_2$ layers (n≈1.46) in the DBR. The theoretical mirror reflectivities are about 0.96, which gives a theoretical width of about 11 nm, which is close to what is observed. By selecting materials for the mirror layers from a large variety of materials with a wide range of refractive indices, the spectral width and reflectance width can be tailored independently of the total mirror reflectivity.

A lossless microcavity filter transmits 100 percent of the light on resonance if the top and bottom DBR mirrors are of equal reflectivities, or $R_1=R_2$. Similar mirror reflectivity constraints are also seen in resonant cavity enhanced (RCE) photodetectors. For a RCE photodetector, with an active medium with single-pass transmission T (including any antinode effects), the detection efficiency is a maximum only when $R_1=R_2T^2$, with a value of 100 percent only if $R_2=1$. The equal mirror reflectivity constraint of the microcavity of the RC-PIN photodetector is certainly easier to realize than the dual constraints needed in a RCE detector. In both types of optimized devices, the maximum theoretical contrast ratio between on-resonance detection and off-resonance detection is given by $(1+R_1^2)/(1-R_1)^2$.

Figure 3:
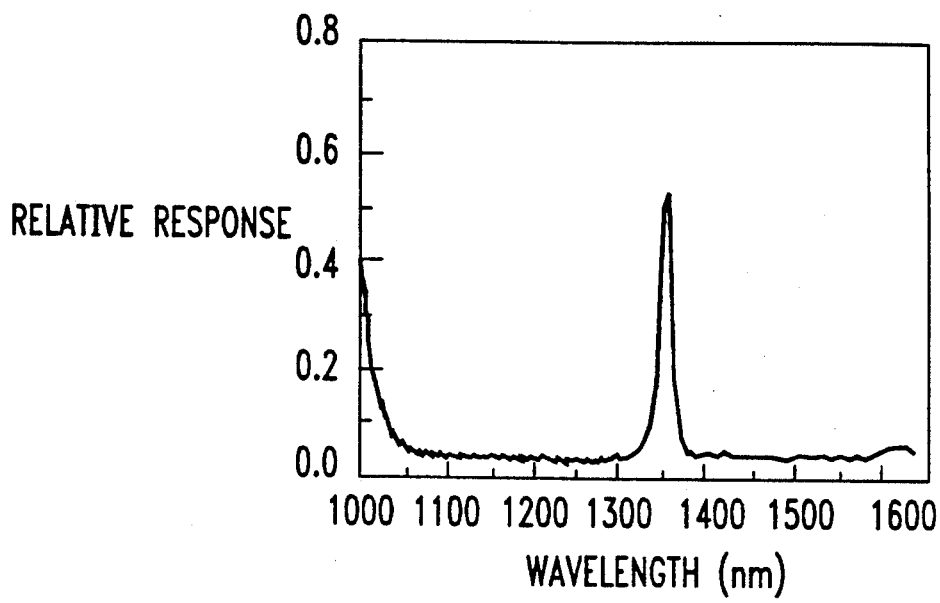
FIG. 3 is a plot of the detected photocurrent from a resonant cavity p-i-n (RC-PIN) photodetector with a deposited Fabry-Perot cavity, divided by the photocurrent from a reference detector with an anti-reflection coating but no cavity.

The response of a detector with cavity versus wavelength, relative to a detector with anti-reflective coating, is given in FIG. 3. The figure illustrates that light is detected only at the resonance wavelength of 1350 nm, whereas the detector is insensitive to all other wavelengths. The detection is low from 1100 nm to 1800 nm except for the 14 nm wide resonance at 1350 nm where the relative detection is 50 percent. The reflected light can, in principle, be detected by other RC-PIN photodetectors, constituting a wavelength-division multiplexing system. The maximum relative responsivity at 1350 nm wavelength is 52 percent while the response off resonance is about 4 percent. The discrepancy between the 10 percent reflection and the 52 percent response can theoretically be explained by an absorption coefficient of 150 cm$^{-1}$ in the amorphous silicon. Growth at higher temperatures, or by CVD deposition can produce silicon layers with reduced absorption, and therefore greater detection efficiency. Other high index materials, such as $TiO_2$, can be substituted with no absorption loss, but with a lesser wavelength range of suppression. Other possible sources of efficiency loss are light scattering in the films, or a slightly bumpy substrate surface resulting in a smearing of the microcavity transmission peak. The off-resonance response of 4 percent is higher than the calculated 0.1 percent for a perfect layer structure with mirror reflectivities of 96 percent. This can be due to scattered light, either from the surrounding detector mount, or within the layers themselves, or from the far side of the detector. Any reflections from the far side of detector, whether specular or diffuse, will reduce the detected signal on resonance, and increase it off resonance.

The resonance wavelength is relatively insensitive to small deviations of incidence angle from the normal, but shifts quickly at higher angles. The resonance wavelength versus incidence angle $\theta_0$ is given by:

$$\lambda_{res}(\theta_0) = \lambda_{r0} \cos(\sin^{-1}(\sin(\theta_0)/n_c)) \quad (3)$$

The value $n_c$ is an effective index of refraction for the microcavity, which can be determined by fitting this formula to measured or calculated shifts with angle. For the exemplary RC-PIN devices $n_c$ is approximately 1.75. The range of angles of a monochromatic incoming light beam should be restricted such that all of the rays are within the resonance peak. Devices with thin resonance peaks or with low $n_c$ therefore require more collimated input beams for maximum detection efficiency. For the RC-PIN detector structure, the resonance width is 14 nm at a wavelength of 1350 nm. The maximum coupling efficiencies for ideal-wavelength monochromatic light transmitted through (or detected by) a cavity with an effective index $n_c$, from a light cone of numerical aperture $N_A = \sin(\theta_{0,max})$, for various fractional linewidths, $t = \Delta\lambda_0/\lambda_0$, is given by the following formula:

$$\text{Max. Efficiency}(N_A/n_c) = \frac{\tan^{-1}\left(\frac{1 - \cos(\sin^{-1}(N_A/n_c))}{t}\right)}{\frac{1 - \cos(\sin^{-1}(N_A/n_c))}{t}} \quad (4)$$

Figure 4:
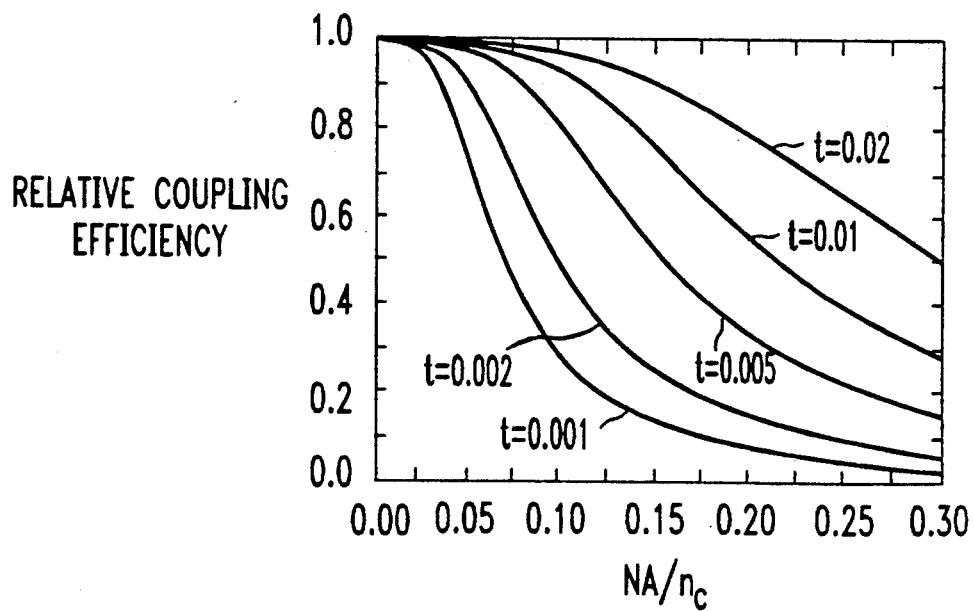
FIG. 4 is a series of plots of a maximum relative response of the Fabry-Perot cavity of the RC-PIN photodetector for various fractional resonance widths (t) versus the numerical aperture of the incoming light divided by the effective refractive index of the cavity $N_A/n_c$.

The calculation assumes a uniform intensity of light over all solid angles within the light cone, and includes only the effect of resonance shift with angle, assuming no change in the peak detection efficiency with angle. A graph of efficiency relative to a parallel beam for various fractional linewidths is given in FIG. 4. One can see that for the device with $t=0.01$, and $n_c=1.75$, the relative coupling efficiency for a light cone with $N_A<0.29$ is greater than 0.69, and for $N_A<0.20$ is greater than 0.89.

An incident beam, with rays experiencing resonance wavelength shifts up to the value of the resonance width, results in relative efficiency of 78.5 percent. For larger $N_A$ values, the relative efficiency drops rapidly.

A microcavity should therefore be designed to have a relative efficiency larger than 78.5 percent for the given $N_A$ of the light source. The exemplary cavity meets this criterion for numerical aperture values of less than 0.25. Larger $N_A$ values can be achieved by designing a slightly wider spectral width, or a similar spectral width and a larger $n_c$. The cavity index $n_c$ can be increased by replacing the central $SiO_2$ region, or even all $SiO_2$ layers, by a higher index material.

It is also possible to create an equivalent cavity with combination in which the active layer with a high refractive index is bounded by DBR mirrors with low index material being adjacent to the active layer. An important prerequisite would be the ability of the middle layer to be highly transparent to optical radiation.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A photodetector which comprises a photodiode comprising a substrate, a light-absorbing region and electrodes to the substrate and the light-absorbing region, said photodiode having a light-collecting surface, in which a Fabry-Perot cavity is formed upon said light-collecting surface, said Fabry-Perot cavity including, in an ascending order from said light-collecting surface, a distributed Bragg reflector (DBR) bottom mirror, an active region and a DBR top mirror, each of said top and bottom mirrors comprises a plurality of periods, each period comprising a layer of a material with higher refractive index and a layer of a material with lower refractive index than the other layer in the period, a layer with higher refractive index in one period being adjacent to a layer with lower refractive index in another period of the mirror, each of said layers in the DBR mirrors being $\lambda/4$ thick, said active region having a refractive index which is different from a refractive index of each adjacent layer in the periods adjoining the light absorbing region, said active region being $\lambda/2$ thick.

2. The photodetector of claim 1, in which said material with high refractive index is selected from the group consisting of Si, ZnS, $TiO_2$, GaP, cubic zirconia, and $SiN_x$, and said material with low refractive index is selected from the group consisting of $TiO_2$, $SiN_x$, cubic zirconia, $Al_2O_3$, phosphor silica glass, titanium silica glass, borosilicate glass, $SiO_2$, $MgF_2$, and $CaF_2$.

3. The photodetector of claim 1 in which said material with high refractive index comprises Si, and said material with low refractive index comprises $SiO_2$.

4. The photodetector of claim 1, in which a surface of said substrate is the light-collecting surface.

5. The photodetector of claim 1, in which a surface of said light absorbing region is the light-collecting surface.

6. The photodetector of claim 1, in which said photodiode comprises an InGaAs light-absorbing region grown on an InP substrate, and said material with high refractive index comprises Si, said material with low refractive index comprises $SiO_2$, and said active region comprises $SiO_2$.

7. The photodetector of claim 6, in which a material of a $\lambda/4$ thick lowermost layer of said bottom DBR mirror adjacent the light-collecting surface of the photodiode is a low refractive index material comprising $SiN_x$.

8. The photodetector of claim 6, in which a material of a $\lambda/4$ thick uppermost layer of said top DBR mirror is a low refractive index material comprising $Al_2O_3$.

* * * * *